(12) United States Patent
Wang et al.

(10) Patent No.: US 9,116,372 B2
(45) Date of Patent: Aug. 25, 2015

(54) DRIVING SUBSTRATE AND DISPLAY APPARATUS USING THE SAME

(75) Inventors: Henry Wang, Hsinchu (TW); Ted-Hong Shinn, Hsinchu (TW); Chia-Chun Yeh, Hsinchu (TW); Wei-Chou Lan, Hsinchu (TW)

(73) Assignee: E INK HOLDINGS INC., Hsinchu (TW)

( * ) Notice: Subject to any disclaimer, the term of this patent is extended or adjusted under 35 U.S.C. 154(b) by 357 days.

(21) Appl. No.: 13/480,909

(22) Filed: May 25, 2012

(65) Prior Publication Data

US 2013/0076601 A1 Mar. 28, 2013

(30) Foreign Application Priority Data

Sep. 23, 2011 (TW) .............................. 100134450 A

(51) Int. Cl.
G09G 3/20 (2006.01)
G02F 1/1333 (2006.01)
G02F 1/167 (2006.01)
H01L 27/12 (2006.01)
G02F 1/1362 (2006.01)

(52) U.S. Cl.
CPC .... G02F 1/133305 (2013.01); G02F 1/136286 (2013.01); G02F 1/167 (2013.01); H01L 27/124 (2013.01); G02F 2001/13629 (2013.01); G02F 2001/136263 (2013.01)

(58) Field of Classification Search
CPC ...... G02F 1/1362; G02F 1/167; H01L 27/124
USPC ................... 345/173–184; 178/18.01–18.09, 178/19.01–19.04
See application file for complete search history.

(56) References Cited

U.S. PATENT DOCUMENTS

| 2002/0135310 | A1 | 9/2002 | Amano | |
|---|---|---|---|---|
| 2009/0244689 | A1* | 10/2009 | Lin | ................................ 359/296 |
| 2011/0090191 | A1* | 4/2011 | Lee et al. | ....................... 345/206 |

FOREIGN PATENT DOCUMENTS

| CN | 101408816 A | 4/2009 |
|---|---|---|
| CN | 101738806 A | 6/2010 |
| CN | 101241918 B | 7/2011 |

OTHER PUBLICATIONS

Taiwan Intellectual Property Office, "Office Action", Sep. 30, 2013, Taiwan.
China Patent Office, "Office Action", Nov. 4, 2014.

* cited by examiner

*Primary Examiner* — Kumar Patel
*Assistant Examiner* — Insa Sadio
(74) *Attorney, Agent, or Firm* — WPAT, PC; Justin King

(57) ABSTRACT

An exemplary driving substrate includes a substrate, a plurality of first and second signal transmission lines, a first insulation layer and a plurality of switch devices. The first signal transmission lines are disposed on the substrate, and each includes a first line segment(s) and a first connecting segment(s). The first insulation layer is disposed between each first line segment and each first connecting segment, and each first connecting segment is electrically connected to the adjacent first line segment(s) through an opening(s) of the first insulation layer. The second signal transmission lines are disposed on the substrate and electrically insulated and intersected with the first signal transmission lines thereby defining a plurality of pixel regions on the substrate. The switch devices are respectively disposed in the pixel regions, and each is electrically connected to corresponding first and second signal transmission lines. The driving substrate has better reliability.

19 Claims, 11 Drawing Sheets

DRIVING SUBSTRATE AND DISPLAY APPARATUS USING THE SAME

TECHNICAL FIELD

The present invention relates to a display apparatus, and more particularly to a driving substrate of a display apparatus and a display apparatus using the driving substrate.

BACKGROUND

With the development of flat display technology, portable electronic products equipped with a display apparatus are getting more and more popular in market. Moreover, because portable electronic products focus much on the development of lighter and more compact display products, it is necessary to have a lighter and more compact display apparatus.

Compared to other display apparatuses, flexible display apparatus is not only light and compact but also is flexible thereby seldom resulting in breaks. Therefore, the flexible display apparatus has become one of the most important products in the display industries and has been widely adopted by many portable electronic products.

However, because the driving substrate, which is an essential component of a flexible display apparatus, uses metallic signal transmission lines for the signal transmission and these metallic signal transmission lines usually are brittle and have a poor ductility, thereby after being bent several times, these metallic signal transmission lines may crack or even break, which may further cause display flaws or even damages to the flexible display apparatus. Therefore, the conventional flexible display apparatus usually has poor reliability.

SUMMARY OF EMBODIMENTS

The present invention provides a driving substrate having enhanced reliability.

The present invention further provides another driving substrate to improve reliability.

The present invention further provides a display apparatus having enhanced reliability.

An embodiment of the present invention provides a driving substrate, which includes a substrate, a plurality of first signal transmission lines, a first insulation layer, a plurality of second signal transmission lines and a plurality of switch devices. The first signal transmission lines are disposed on the substrate in a first direction, and each the first signal transmission line includes at least one first line segment and at least one first connecting segment. Each first connecting segment is electrically connected to the adjacent first line segment(s). The first insulation layer is disposed between each first line segment and each first connecting segment. The first insulation layer includes at least one first opening to expose at least one portion of each first line segment, and each first connecting segment is electrically connected to the first line segment through the corresponding first opening(s). The second signal transmission lines are disposed on the substrate in a second direction and electrically insulated and intersected with the first signal transmission lines thereby defining a plurality of pixel regions on the substrate. The first and second directions are mutually perpendicular. The switch devices are respectively disposed in the pixel regions, and each switch device is electrically connected to the corresponding first signal transmission line and the corresponding second signal transmission line.

An embodiment of the present invention further provides a driving substrate, which includes a substrate, a plurality of signal transmission lines and an insulation layer. The signal transmission lines are disposed on the substrate and each signal transmission line includes at least one line segment and at least one connecting segment. Each line segment is disposed on a surface of the substrate. The insulation layer is disposed to cover each line segment. The insulation layer includes at least one opening to expose at least one portion of each line segment. Each connecting segment is disposed on the insulation layer and electrically connected to the adjacent line segment(s) through the corresponding opening(s).

An embodiment of the present invention still further provides a display apparatus, which includes any one of the aforementioned driving substrates, an opposite substrate and a display layer. The opposite substrate is disposed to face to the driving substrate. The display layer is disposed between the driving substrate and the opposite substrate.

In summary, in the driving substrate of each embodiment of the present invention, because the single signal transmission line is constructed by at least one line segment and at least one connecting segment which are disposed on different layers, the signal transmission lines in the present invention accordingly can have a flexural property. In other words, even the driving substrate has been bent many times, the signal transmission lines can be prevented from cracking or breaking. Therefore, the driving substrate in each embodiment of the present invention has better reliability, so that the display apparatus of the present invention has better reliability consequently.

BRIEF DESCRIPTION OF THE DRAWINGS

The above embodiments will become more readily apparent to those ordinarily skilled in the art after reviewing the following detailed description and accompanying drawings, in which.

DETAILED DESCRIPTION OF PREFERRED EMBODIMENTS

The disclosure will now be described more specifically with reference to the following embodiments. It is to be noted that the following descriptions of preferred embodiments are presented herein for purpose of illustration and description only. It is not intended to be exhaustive or to be limited to the precise form disclosed.

The driving substrate of the present invention will now be described more specifically with reference to the figures. It is to be noted that the number of the signal transmission lines in the following diagrams of driving substrates is only exemplary; in other words, the present invention does not limit the number of the signal transmission lines in the driving substrate.

Figure 1:
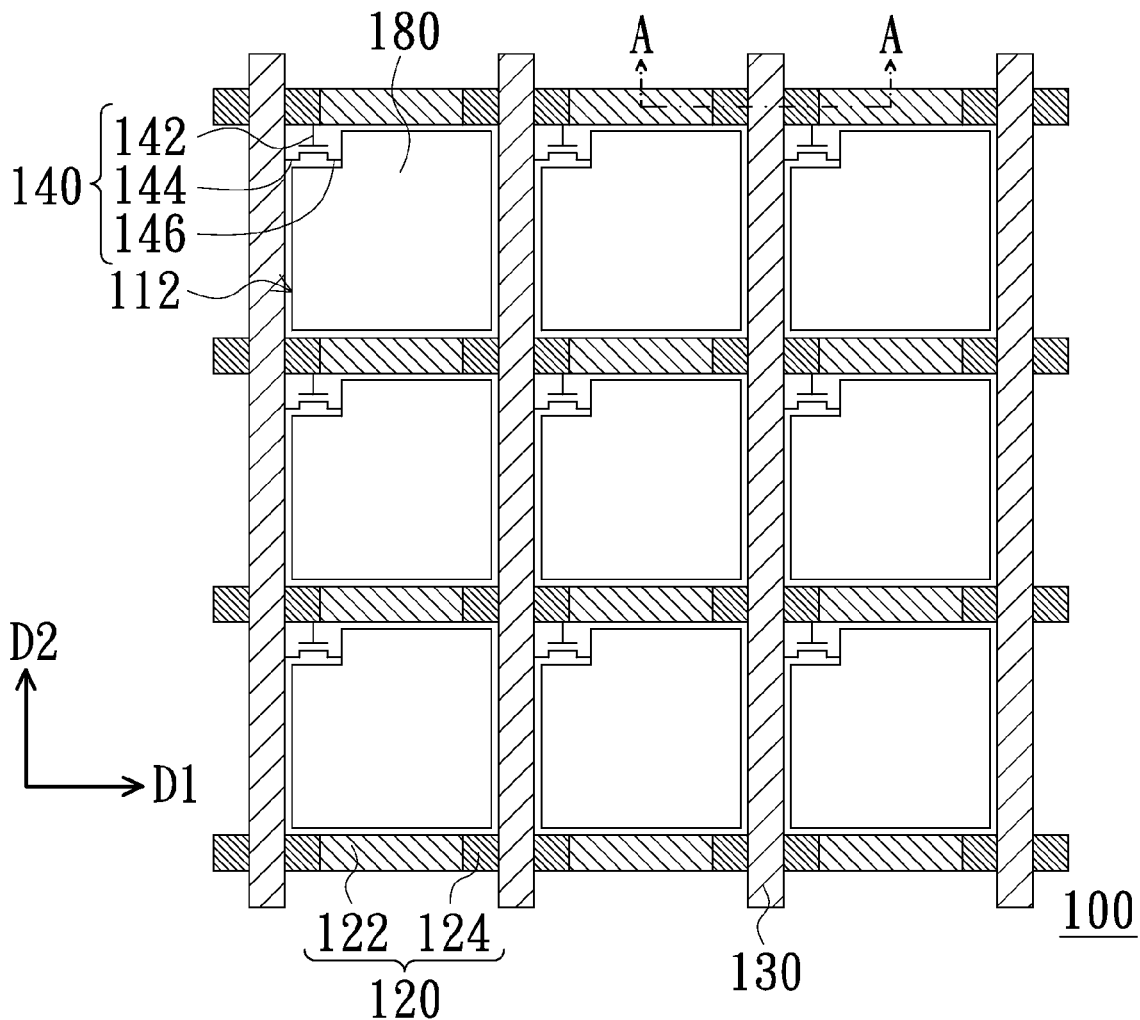
FIG. 1 is a schematic diagram of a driving substrate in accordance with an embodiment of the present invention.
Figure 2:
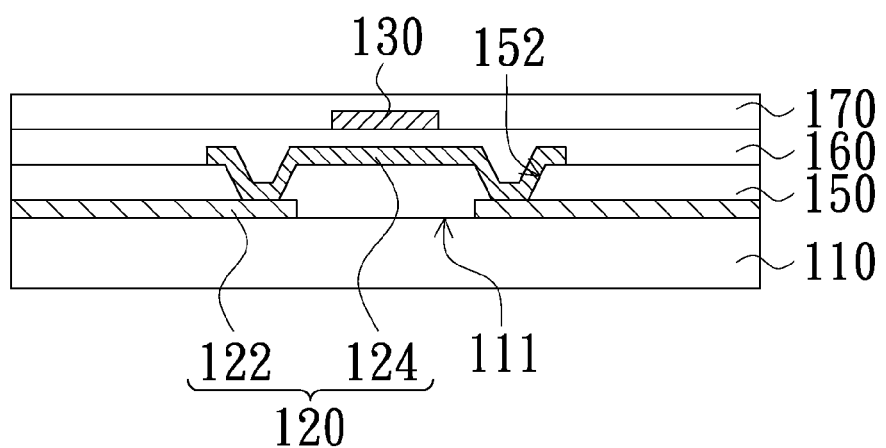
FIG. 2 is a schematic cross-sectional diagram taken along line A-A of FIG. 1.

FIG. 1 is a schematic diagram of a driving substrate in accordance with an embodiment of the present invention, and FIG. 2 is a schematic cross-sectional diagram along line A-A of FIG. 1. Referring to FIGS. 1 and 2, the driving substrate 100 includes a substrate 110, a plurality of first signal transmission lines 120, a plurality of second signal transmission lines 130 and a plurality of switch devices 140. These first signal transmission lines 120 are disposed on the substrate 110 in a first direction D1 and these first signal transmission lines 120 for example are parallel to each other. These second signal transmission lines 130 are disposed on the substrate 110 in a second direction D2 and these second signal transmission lines 130 for example are parallel to each other. These first and second transmission lines 120, 130 are electrically insulated and intersected with each other thereby defining a plurality of pixel regions 112 on the substrate 110. Because the first and second directions D1, D2 are mutually perpendicular, these first and second transmission lines 120, 130 are mutually perpendicular. Therefore, each pixel region 112 has a rectangle structure. These switch devices 140 are respectively disposed in the pixel regions 112; in other words, each pixel region 112 is disposed with one switch device 140. In addition, each switch device 140 is electrically connected to the corresponding first signal transmission line 120 and the corresponding second signal transmission line 130.

Each first signal transmission line 120 includes at least one first line segment 122 and at least one first connecting segment 124. In particular, it is to be noted that each first signal transmission line 120 exemplified in the present embodiment consists of more than one first line segments 122 and more than one first connecting segments 124, wherein the layer where these first line segments 122 are disposed is different to the layer where these first connecting segments 124 are disposed. In addition, for each first signal transmission line 120, these first line segments 122 are separated to each other, and the first connecting segment 124 is electrically connected to at least one adjacent first line segment 122. Specifically, at least one of the first connecting segments 124 is electrically connected to one first line segment 122 because of being adjacent to only one first line segment 122. At least one of the first connecting segments 124 is electrically connected to two first line segments 122 because of being adjacent to two first line segments 122.

In the present embodiment, the substrate 110 is a rigid substrate, such as a glass substrate or other proper substrate, or a flexible substrate, such as a plastic substrate or other substrates with a flexural property. These first signal transmission lines 120 for example are scan lines and these second signal transmission lines 130 for example are data lines. Each first line segment 122, each first connecting segment 124 and each second signal transmission line 130 for example respectively are single metallic layer or a stacking structure which is stacked by multi metallic layers. The material of the single metallic layer may be, but not limited to, chromium or an alloy of molybdenum and chromium. The stacking structure may be, but not limited to, stacked sequentially by one chromium metallic layer, one aluminum metallic layer and another one chromium metallic layer, or stacked sequentially by one molybdenum metallic layer, one neodymium alloy layer and another one molybdenum metallic layer.

Each first line segment 122 for example is disposed on a surface 111 of the substrate 110. The driving substrate 100 further includes a first insulation layer 150, which is disposed between each first line segment 122 and each first connecting segment 124. The first insulation layer 150 covers each first line segment 122 and the surface 111 of the substrate 110. The first insulation layer 150 has at least one opening 152, and each first line segment 122 can have at least one portion to be exposed through the opening(s) 152. Each first connecting segment 124 is disposed on the first insulation layer 150, and is electrically connected to the adjacent first line segment(s) 122 through the corresponding opening(s) 152. It is understood that, for each first signal transmission line 120, the number of the opening(s) 152 is dependent on the numbers of the first line segment(s) 122 and first connecting segment(s) 124. For example, in the present embodiment each first signal transmission line 120 has multiple openings 152 due to each first signal transmission line 120 exemplarily constructed by more than one first line segments 122 and more than one first connecting segment 124. Moreover, in the case that the first line segment 122 is electrically connected to two first connecting segments 124, there may be two openings 152 related to this first line segment 122 and accordingly two end portions of this first line segment 122 may be respectively exposed by these two related openings 152. On the other hand, if the first line segment 122 is electrically connected to one first connecting segment 124, there may be only one opening 152 related to this first line segment 122 and accordingly only one portion of this first line segment 122 may be exposed by this one related opening 152.

Besides, the driving substrate 100 may further include a second insulation layer 160, which is disposed to cover the first insulation layer 150 and each first connecting segment 124. These second signal transmission lines 130 are disposed on the second insulation layer 160. The driving substrate 100 may further include a third insulation layer 170, which is disposed to cover these second signal transmission lines 130. In addition, the first, second and third insulation layers 150, 160 and 170 for example are made of organic materials, such as novolak resin or lamination materials, or made of inorganic materials, such as silicon nitride (SiN), silicon oxide (SiO) or silicon nitride oxide (SiNxOy).

The switch device 140 for example is a thin film transistor. In each pixel region 112, a gate 142 of the switch device 140 is electrically connected to the first line segment 122 or the first connecting segment 124 of the corresponding first signal transmission 120 and a source 144 of the switch device 140 is electrically connected to the corresponding second signal transmission 130. In the driving substrate 100, each pixel region 112 further includes a pixel electrode 180, which is disposed on the third insulation layer 170 and electrically connected to a drain 146 of the corresponding switch device 140 through an opening (not shown) of the third insulation layer 170. In the present embodiment, these second signal transmission lines 130 for example are disposed to intersect with these first connecting segments 124, and the second insulation layer 160 is disposed between the second signal transmission lines 130 and the first connecting segments 124.

In the driving substrate 100 of the present embodiment, these first signal transmission lines 120 can have a flexural property due to each first signal transmission line 120 constructed by at least one first line segment 122 and at least one first connecting segment 124. Therefore, even the substrate 110 is a flexible substrate and the driving substrate 100 has been bent for many times, these first signal transmission lines 120 are prevented from cracking or breaking because of the flexural property. Accordingly, the driving substrate 100 of the present embodiment has better reliability, so that the display apparatus, which adopts the driving substrate 100, consequently has better reliability.

Figure 3:
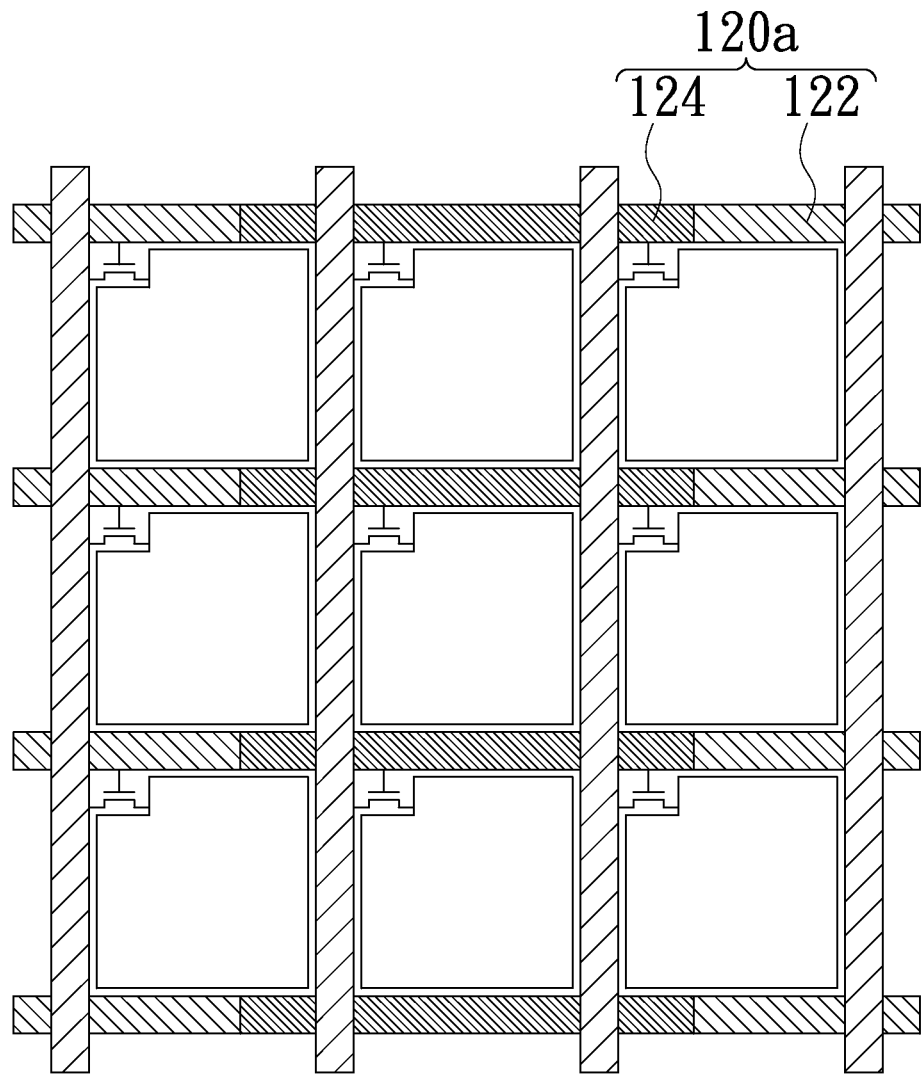
FIG. 3 is a schematic diagram of a driving substrate in accordance with another embodiment of the present invention.
Figure 4:
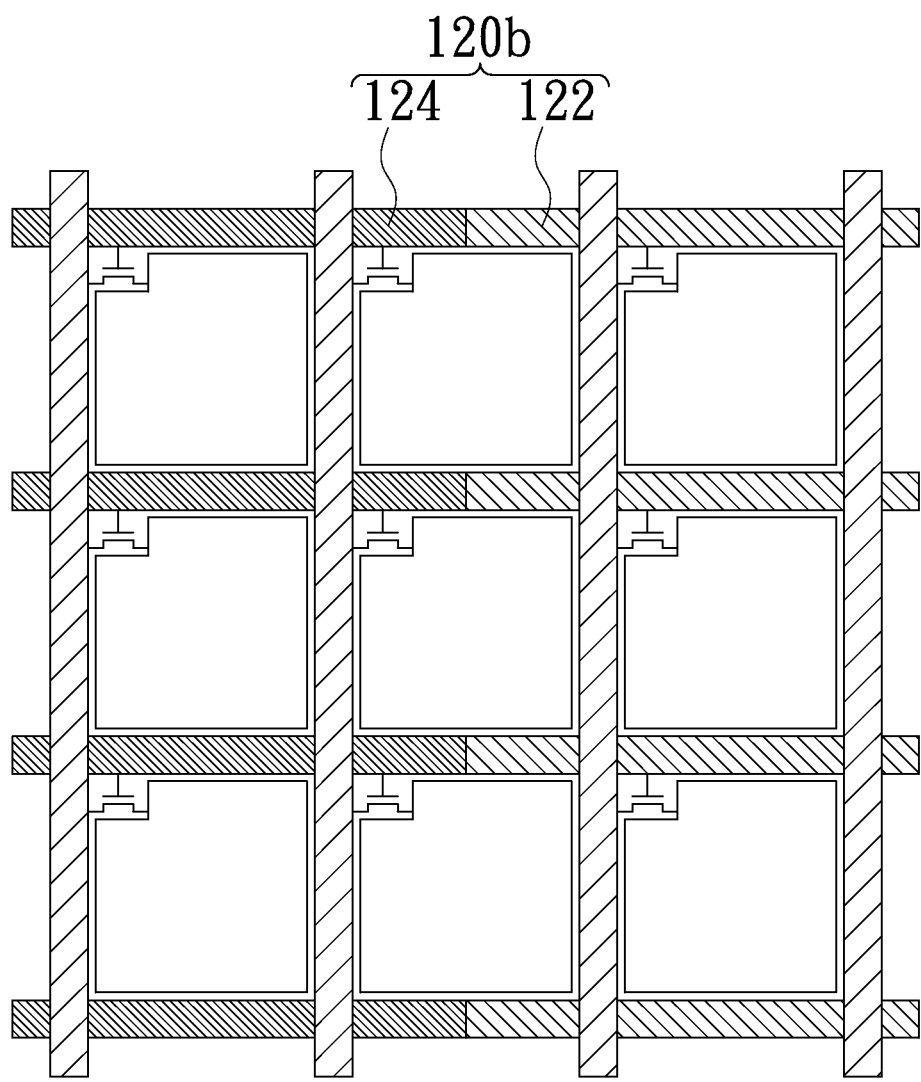
FIG. 4 is a schematic diagram of a driving substrate in accordance with another embodiment of the present invention.
Figure 5:
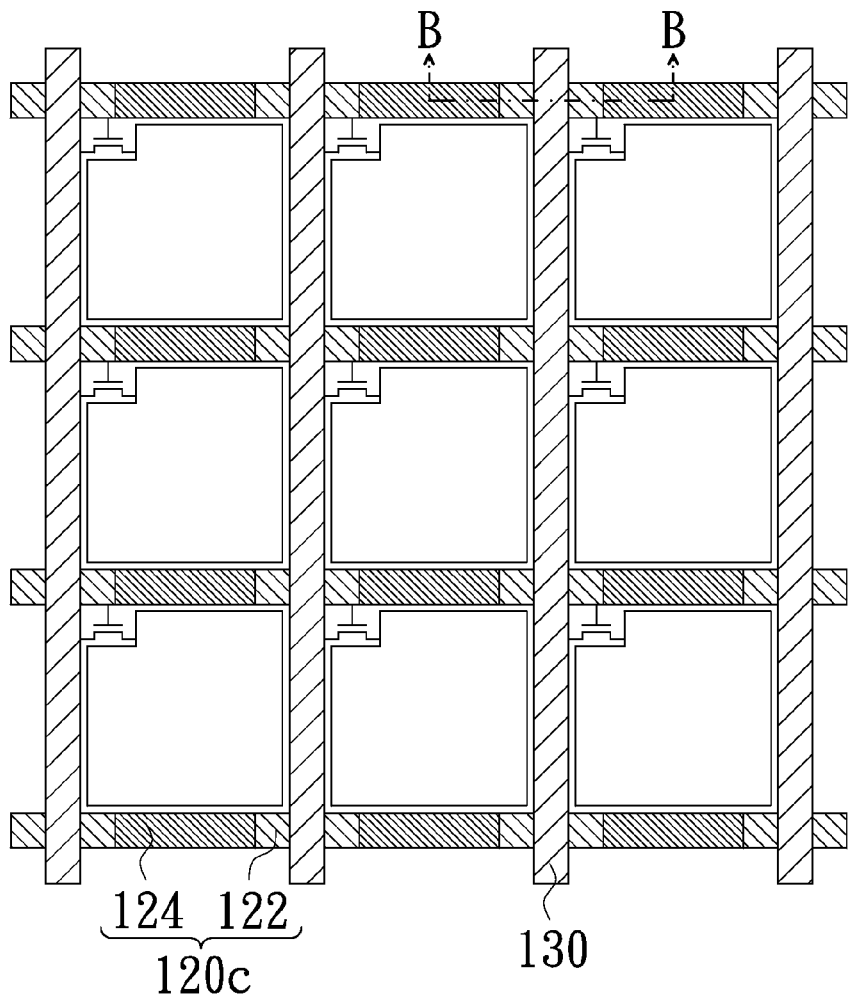
FIG. 5 is a schematic diagram of a driving substrate in accordance with another embodiment of the present invention.
Figure 6:
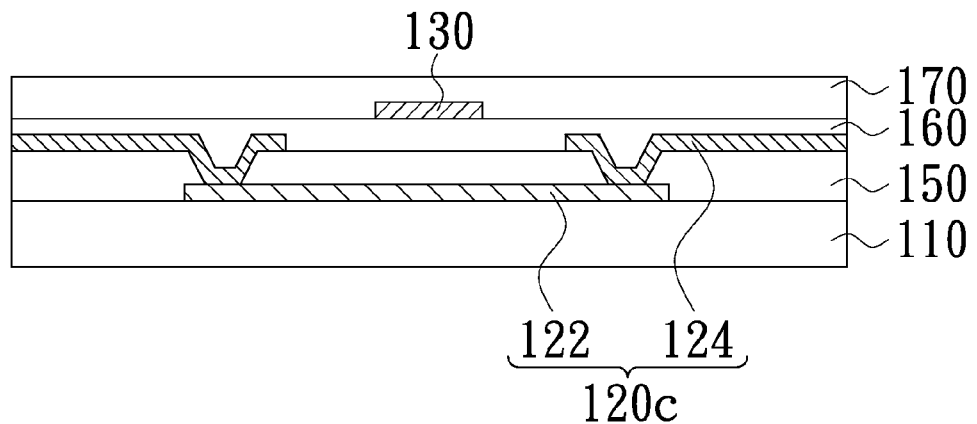
FIG. 6 is a schematic cross-sectional diagram taken along line B-B of FIG. 5.

It is to be noted that, for each first signal transmission line 120, the present invention does not limit the numbers of the first line segment(s) 122 and the first connecting segment(s) 124. For example, in another embodiment as depicted in FIG. 3, each first signal transmission line 120a is exemplarily constructed by two first line segments 122 and one first connecting segment 124 electrically connected to the two first line segments 122. In still another embodiment as depicted in FIG. 4, each first signal transmission line 120b is exemplarily constructed by one first line segment 122 and one first connecting segment 124 electrically connected to the first line segment 122. In addition, although these second signal transmission lines 130 are disposed to exemplarily intersect with these first connecting segments 124 in the present embodiment as depicted in FIG. 1, in another embodiment as depicted in FIGS. 5 and 6, these second signal transmission lines 130 may be disposed to intersect with these first line segments 122 of these first signal transmission lines 120c, and the second insulation layer 160 is disposed between the second signal transmission lines 130 and the first line segments 122.

Figure 7:
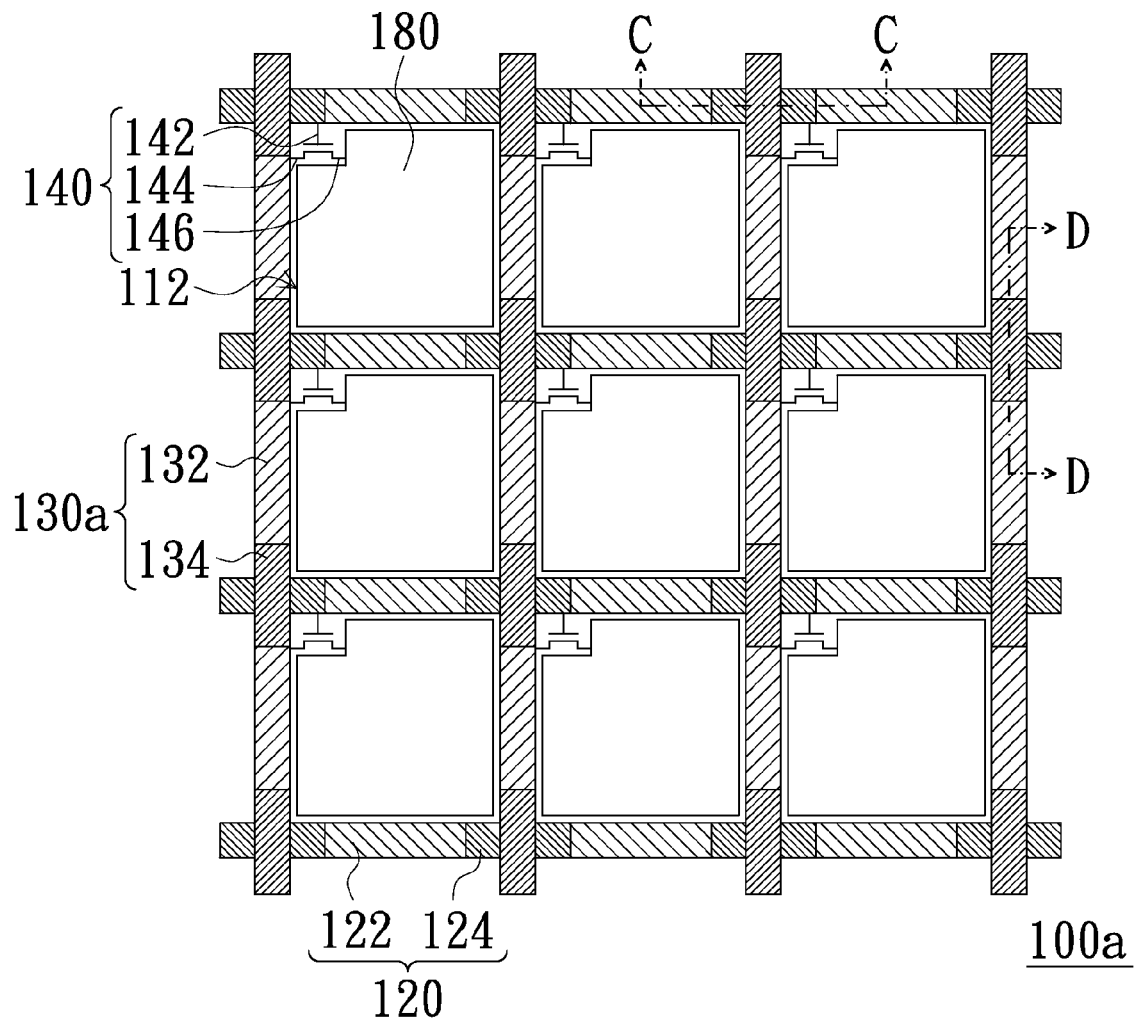
FIG. 7 is a schematic diagram of a driving substrate in accordance with another embodiment of the present invention.
Figure 8:
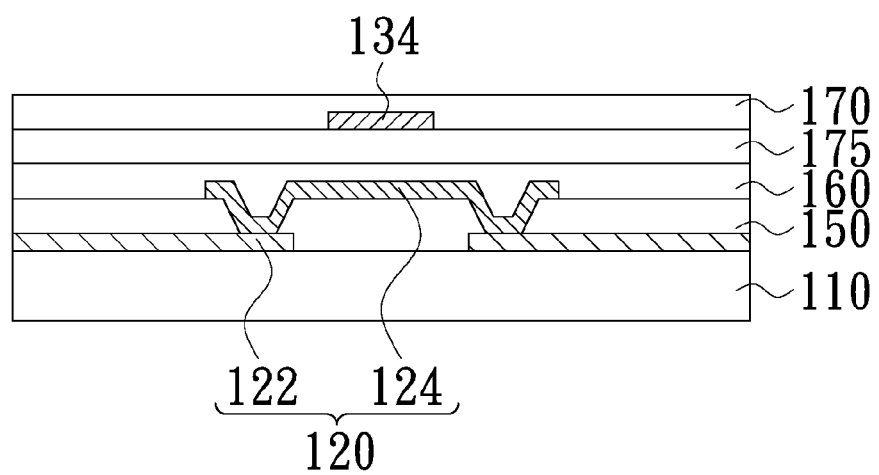
FIG. 8 is a schematic cross-sectional diagram taken along line C-C of FIG. 7.
Figure 9:
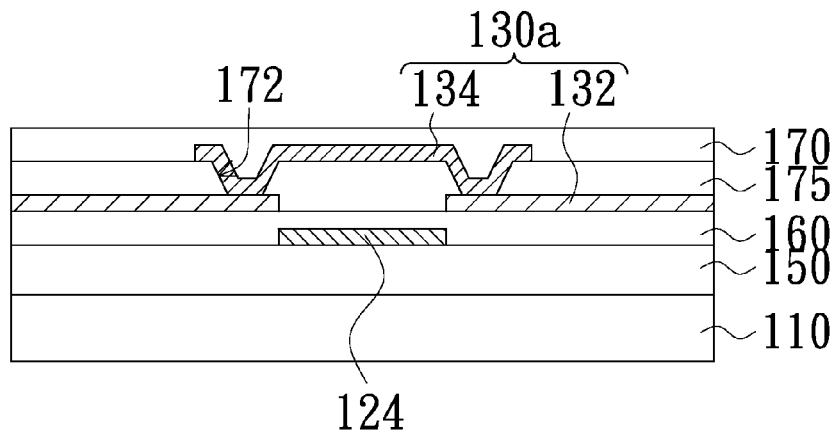
FIG. 9 is a schematic cross-sectional diagram taken along line D-D of FIG. 7.

FIG. 7 is a schematic diagram of a driving substrate in accordance with another embodiment of the present invention, and FIGS. 8 and 9 are schematic cross-sectional diagrams respectively taken along lines C-C and D-D of FIG. 7. Referring to FIGS. 7, 8 and 9, the driving substrate 100a in the present embodiment is similar to the aforementioned driving substrate 100 of FIG. 1, the main difference of the driving substrate 100a from the driving substrate 100 is that each second signal transmission line 130a of the driving substrate 100a includes at least one second line segment 132 and at least one second connecting segment 134. In particular, it is to be noted that each second signal transmission line 130a exemplified in the present embodiment includes more than one second line segments 132 and more than one second connecting segments 134. As shown in FIGS. 8 and 9, each second line segment 132 for example is disposed on the second insulation layer 160. The third insulation layer 170 is disposed to cover each second signal transmission line 130a.

The driving substrate 100a further includes a fourth insulation layer 175, which is disposed between the second and third insulation layers 160, 170 so as to cover each second line segments 132. The material of the fourth insulation layer 175 is similar to that of the aforementioned insulation layers 150, 160 and 170, no any unnecessary detail will be given here. Besides, the fourth insulation layer 175 has at least one opening 172, and each second line segments 132 can have at least one portion to be exposed through the opening(s) 172. Each second connecting segment 134 is disposed on the fourth insulation layer 175, and is electrically connected to the adjacent second line segment(s) 132 through the corresponding opening(s) 172.

It is understood that, for each second signal transmission line 130a, the number of the opening(s) 172 is dependent on the numbers of the second line segment(s) 132 and second connecting segment(s) 134. For example, in the present embodiment, each second signal transmission line 130a has multiple openings 172 due to each second signal transmission line 130a exemplarily constructed by more than one second line segments 132 and more than one second connecting segments 134. Moreover, in the case that the second line segment 132 is electrically connected to two second connecting segments 134, there may be two openings 172 related to this second line segment 132 and accordingly two end portions of this second line segment 132 may be respectively exposed by these two related openings 172. On the other hand, if the second line segment 132 is electrically connected to one second connecting segment 134, there may be only one opening 172 related to this second line segment 132 and accordingly only one portion of this second line segment 132 may be exposed by this one related opening 172. Specifically, at least one of the second connecting segments 134 is electrically connected to one second line segment 132 because of being adjacent to only one second line segment 132. At least one of the second connecting segments 134 is electrically connected to two second line segments 132 because of being adjacent to two second line segments 132.

In the present embodiment, although these second connecting segments 134 are exemplarily disposed to intersect with these first signal transmission lines 120, more specifically, intersect with these first connecting segments 124 of these first signal transmission lines 120, and the second and fourth insulation layers 160, 175 are disposed between the first connecting segments 124 and the second connecting segments 134; however, in another embodiment, these second connecting segments 134 can be disposed to intersect with these first line segments 122 of these first signal transmission lines 120. In still another embodiment, these second signal transmission lines 130a for example are disposed to intersect with either these first line segments 122 or these first connecting segments 124 of these first signal transmission lines 120 via these second line segments 132 thereof.

In each pixel region 112, the source 144 of the switch device 140 is electrically connected to the second line segment 132 of the corresponding second signal transmission line 130a. These second line segments 132 and these sources 144 and drains 146 of these switch devices 140 are disposed on a same layer. In each pixel region 112, the pixel electrode 180 for example is disposed on the third insulation layer 170 is electrically connected to the drain 146 of the corresponding switch device 140 through the opening(s) (not shown) of the third and fourth insulation layers 170 and 175.

In the driving substrate 100a of the present embodiment, both these first and second signal transmission lines 120, 130a can have a flexural property due to each first signal transmission line 120 constructed by at least one first line segment 122 and at least one first connecting segment 124 and each second signal transmission line 130a constructed by at least one second line segment 132 and at least one second connecting segment 134. Therefore, even the substrate 110 is a flexible substrate and the driving substrate 100a has been bent for many times, these first and second signal transmission lines 120, 130a are prevented from cracking and breaking because of the flexural property. Accordingly, the driving substrate 100a of the present embodiment has better reliability, so that the display apparatus, which adopts the driving substrate 100a, consequently has better reliability.

It is to be noted that, for each second signal transmission line 130a, the present invention does not limit the numbers of the second line segment(s) 132 and second connecting segment(s) 134. In other words, each second signal transmission line 130a can be constructed by one or more than one second line segments 132 and one or more than one second connecting segments 134, wherein the number of the second line segment(s) 132 relates to that of the second connecting segment(s) 134.

Figure 10:
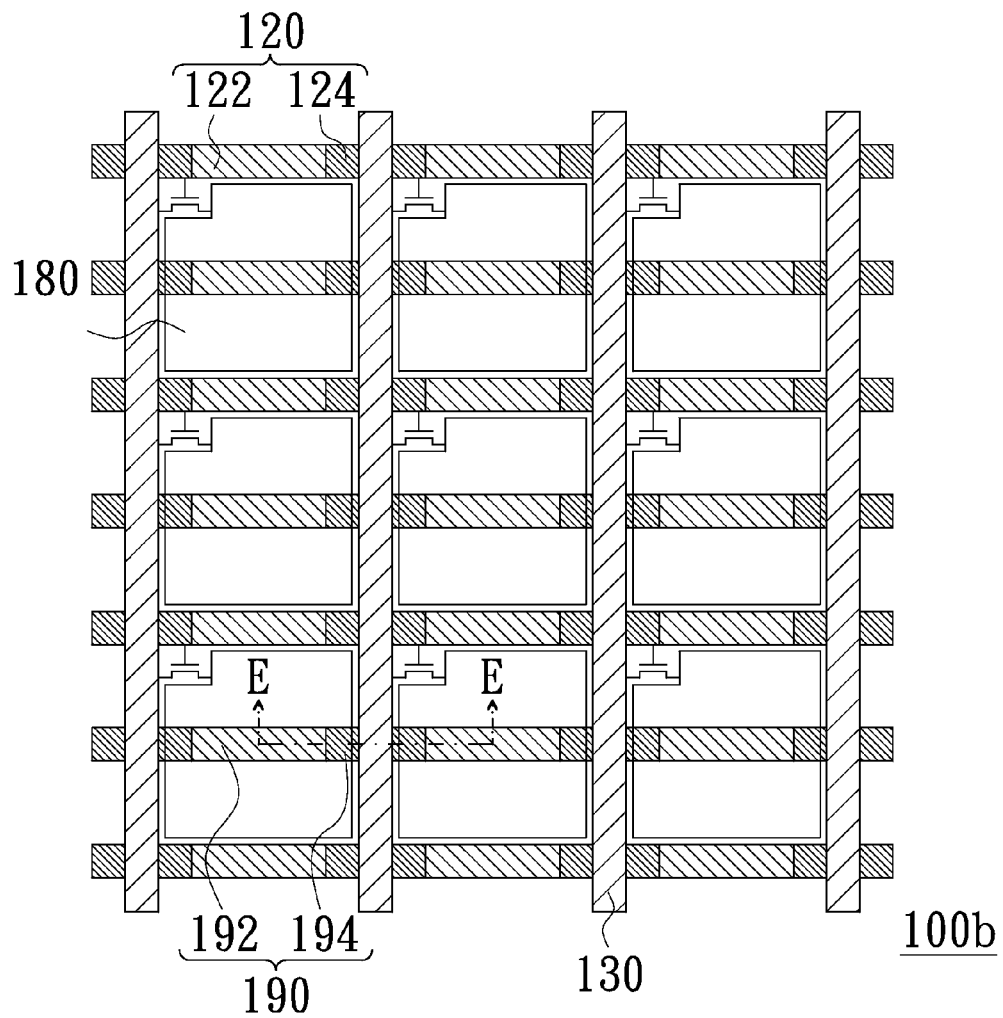
FIG. 10 is a schematic diagram of a driving substrate in accordance with another embodiment of the present invention.
Figure 11:
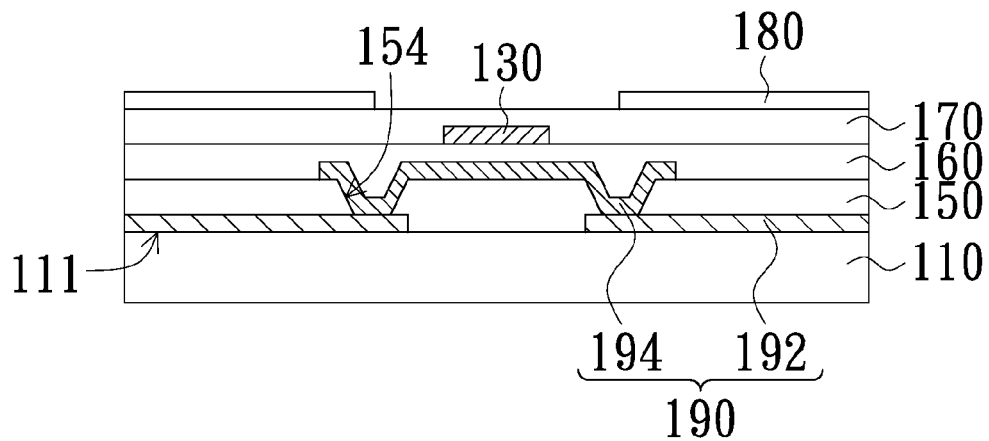
FIG. 11 is a schematic cross-sectional diagram taken along line E-E of FIG. 10.

FIG. 10 is a schematic diagram of a driving substrate in accordance with another embodiment of the present invention, and FIG. 11 is a schematic cross-sectional diagram taken along line E-E of FIG. 10. Referring to FIGS. 10 and 11, the driving substrate 100b of the present embodiment is similar to the aforementioned driving substrate 100 of FIG. 1, except the driving substrate 100b further includes a plurality of common lines 190. These common lines 190 are disposed to intersect with these second signal transmission lines 130, and each common line 190 is disposed between two adjacent first signal transmission lines 120, and these common lines 190 for example are parallel to these first signal transmission lines 120. Each common line 190 includes at least one third line segment 192 and at least one third connecting segment 194. In particular, it is to be noted that each common line 190 exemplified in the present embodiment includes more than one third line segments 192 and more than one third connecting segments 194. Each third line segment 192 is disposed on the surface 111 of the substrate 110 and is covered by the first insulation layer 150. These third line segments 192 and these first line segments 122 for example are disposed on a same layer. The first insulation layer 150 further has at least one opening 154, and each third line segments 192 can have at least one portion to be exposed through the opening(s) 154. Each third connecting segment 194 is disposed on the first insulation layer 150 and is covered by the second insulation layer 160, and these third connecting segments 194 and these first connecting segments 124 for example are disposed on a same layer. Each third connecting segment 194 is electrically connected to the adjacent third line segment(s) 192 through the corresponding opening(s) 154.

It is understood that, for each common line 190, the number of the opening(s) 154 is dependent on the numbers of the third line segment(s) 192 and third connecting segment(s) 194. For example, in the present embodiment, each common line 190 has multiple openings 154 because each common line 190 is exemplarily constructed by more than one third line segments 192 and more than one third connecting segments 194. Moreover, in the case that the third line segment 192 is electrically connected to two third connecting segments 194, there may be two openings 154 related to this third line segment 192 and accordingly two end portions of this third line segment 192 may be respectively exposed by these two related openings 154. On the other hand, if the third line segment 192 is electrically connected to one third connecting segment 194, there may be only one opening 154 related to this third line segment 192 and accordingly only one portion of this third line segment 192 may be exposed by this one opening 154. Specifically, at least one of the third connecting segments 194 is electrically connected to one third line segment 192 because of being adjacent to only one third line segment 192. At least one of the third connecting segments 194 is electrically connected to two third line segments 192 because of being adjacent to two third line segments 192.

In the present embodiment, the third insulation layer 170 for example is disposed to cover these second signal transmission lines 130, and these pixel electrodes 180 for example are disposed on the third insulation layer 170. Besides, these third connecting segments 194 are exemplarily disposed to intersect with these second signal transmission lines 130, and the second insulation layer 160 is disposed between the third connecting segments 194 and the second signal transmission lines 130; however, in another embodiment, these common lines 190 can be disposed to intersect with these second signal transmission lines 130 via these third line segments 192 thereof.

In the driving substrate 100b of the present embodiment, both these first signal transmission lines 120 and these common lines 190 can have a flexural property due to each first signal transmission line 120 constructed by at least one first line segment 122 and at least one connecting segment 124 and each common line 190 constructed by at least one third line segment 192 and at least one third connecting segment 194. Therefore, even the substrate 110 is a flexible substrate and the driving substrate 100b has been bent for many times, these first signal transmission lines 120 and common lines 190 can be prevented from cracking or breaking because of the flexural property. Accordingly, the driving substrate 100b of the present embodiment has better reliability, so that the display apparatus, which adopts the driving substrate 100b, consequently has better reliability.

It is to be noted that, for each common line 190, the present invention does not limit the numbers of the third line segment(s) 192 and third connecting segment(s) 194. In other words, each common line 190 can be constructed by one or more than one third line segments 192 and one or more than one third connecting segments 194, wherein the number of the third line segment(s) 192 relates to that of the third connecting segment(s) 194. Besides, it is to be noted that these common lines 190 in the present embodiment can be also applied to the aforementioned driving substrate 100a of FIG. 7.

Figure 12:
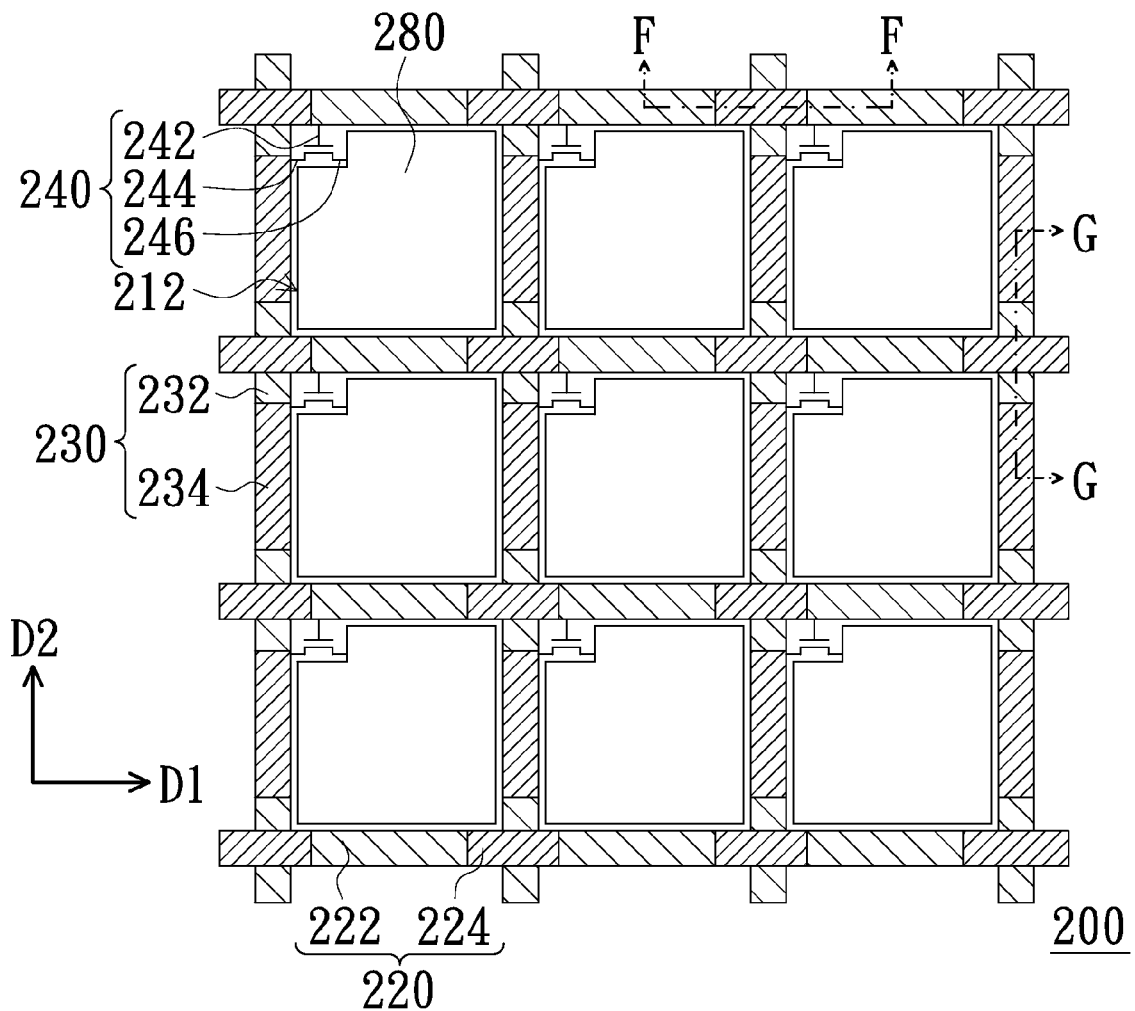
FIG. 12 is a schematic diagram of a driving substrate in accordance with another embodiment of the present invention.
Figure 13:
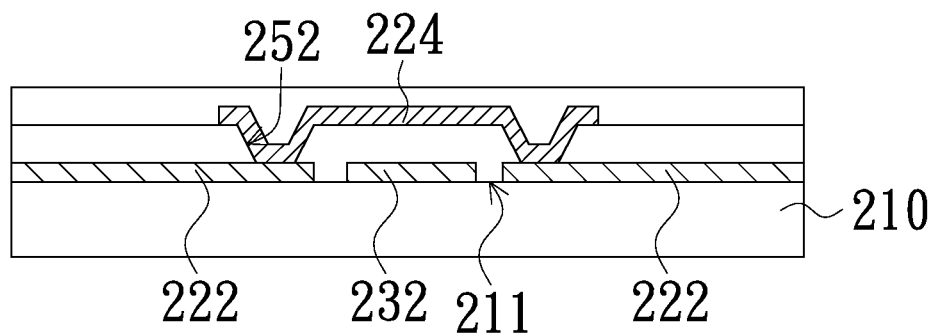
FIG. 13 is a schematic cross-sectional diagram taken along line F-F of FIG. 12.
Figure 14:
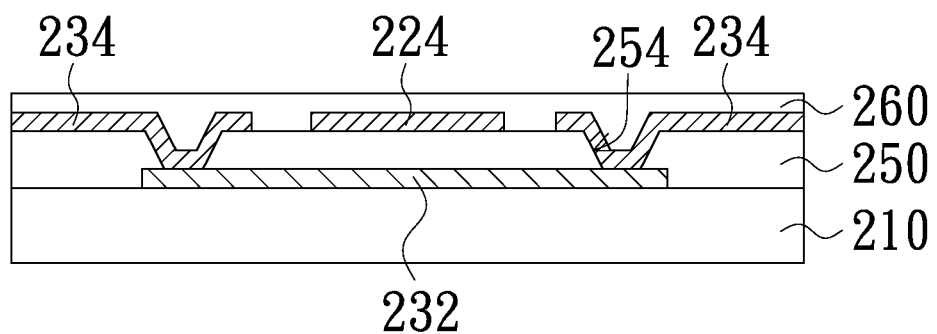
FIG. 14 is a schematic cross-sectional diagram taken along line G-G of FIG. 12.

FIG. 12 is a schematic diagram of a driving substrate in accordance with another embodiment of the present invention, and FIGS. 13 and 14 are schematic cross-sectional diagrams respectively taken along lines F-F and G-G, of FIG. 12. Referring to FIGS. 12, 13 and 14, the driving substrate 200 includes a substrate 210, a plurality of first signal transmission lines 220, a plurality of second signal transmission lines 230, a plurality of switch devices 240 and a first insulation layer 250. These first signal transmission lines 220 are disposed on the substrate 210 in a first direction D1, and these first signal transmission lines 220 for example are parallel to each other. These second signal transmission lines 230 are disposed on the substrate 210 in a second direction D2 and these second signal transmission lines 230 for example are parallel to each other. These first and second transmission lines 220, 230 are electrically insulated and intersected with each other thereby defining a plurality of pixel regions 212 on the substrate 210. Because the first and second directions D1, D2 are mutually perpendicular, these first and second transmission lines 220, 230 are mutually perpendicular. Therefore, each pixel region 212 has a rectangle structure. These switch devices 240 are respectively disposed in the pixel regions 212; in other words, each pixel region 212 is disposed with one switch device 240. In addition, each switch device 240 is electrically connected to the corresponding first signal transmission line 220 and the corresponding second signal transmission line 230.

Each first signal transmission line 220 includes more than one first line segments 222 and more than one first connecting segments 224, and each second signal transmission line 230 includes more than one second line segments 232 and more than one second connecting segments 234. Each first line segment 222 and each second line segment 232 are disposed on a surface 211 of the substrate 210. The first insulation layer 250 is disposed to cover each first line segment 222, each second line segment 232 and the surface 211. The first insulation layer 250 has at least one opening 252 and at least one opening 254. Each first line segment 222 can have at least one portion to be exposed through the opening(s) 252, and each second line segment 232 can have at least one portion to be exposed through the opening(s) 254. Each first connecting segment 224 is disposed on the first insulation layer 250, and is electrically connected to the adjacent first line segment(s) 222 through the corresponding opening(s) 252. Each second connecting segment 234 is disposed on the first insulation layer 250, and is electrically connected to the adjacent second line segment(s) 232 through the corresponding opening(s) 254. The driving substrate 200 may further include a second insulation layer 260, which is disposed to cover the first insulation layer 250, each first connecting segment 224 and each second connecting segment 234.

Moreover, in the case that the first line segment 222 is electrically connected to two first connecting segments 224, there may be two openings 252 related to this first line segment 222 and accordingly two end portions of this first line segment 222 may be respectively exposed by these two related openings 252; on the other hand, if the first line segment 222 is electrically connected to one first connecting segment 224, there may be only one opening 252 related to this first line segment 222 and accordingly only one portion of this first line segment 222 may be exposed by this one related opening 252. Similarly, in the case that the second line segment 232 is electrically connected to two second connecting segments 234, there may be two openings 254 related to this second line segment 232 and accordingly two end portions of this second line segment 232 may be respectively exposed by these two related openings 254; on the other hand, if the second line segment 232 is electrically connected to one second connecting segment 234, there may be only one opening 254 related to this second line segment 232 and accordingly only one portion of this second line segment 232 may be exposed by this one related openings 254. Furthermore, at least one of the first connecting segments 224 is electrically connected to one first line segment 222 because of being adjacent to only one first line segment 222. At least one of the first connecting segments 224 is electrically connected to two first line segments 222 because of being adjacent to two first line segments 222. Similarly, at least one of the second connecting segments 234 is electrically connected to one second line segment 232 because of being adjacent to only one second line segment 232. At least one of the second connecting segments 234 is electrically connected to two second line segments 232 because of being adjacent to two second line segments 232.

In the present embodiment, the switch device 240 for example is a thin film transistor. In each pixel region 212, the gate 242 of the switch device 240 may be electrically connected to the first line segment 222 of the corresponding first signal transmission line 220, and the source 244 of the switch device 240 is electrically connected to the second connecting segment 234 of the corresponding second signal transmission line 230. In the driving substrate 200, each pixel region 212 further includes a pixel electrode 280, which is disposed on the second insulation layer 260 and is electrically connected to the drain 246 of the corresponding switch device 240 through the opening(s) of the second insulation layer 260.

In the driving substrate 200 of the present embodiment, both these first and second signal transmission lines 220, 230 can have a flexural property because each first signal transmission line 220 is constructed by more than one first line segments 222 and more than one first connecting segments 224 and each second signal transmission line 230 is constructed by more than one second line segments 232 and more than one second connecting segments 234. Therefore, even the substrate 210 is a flexible substrate and the driving substrate 200 has been bent for many times, these first and second signal transmission lines 220, 230 can be prevented from cracking or breaking. Accordingly, the driving substrate 200 of the present embodiment has better reliability, so that the display apparatus, which adopts the driving substrate 200, consequently has better reliability.

Figure 15:
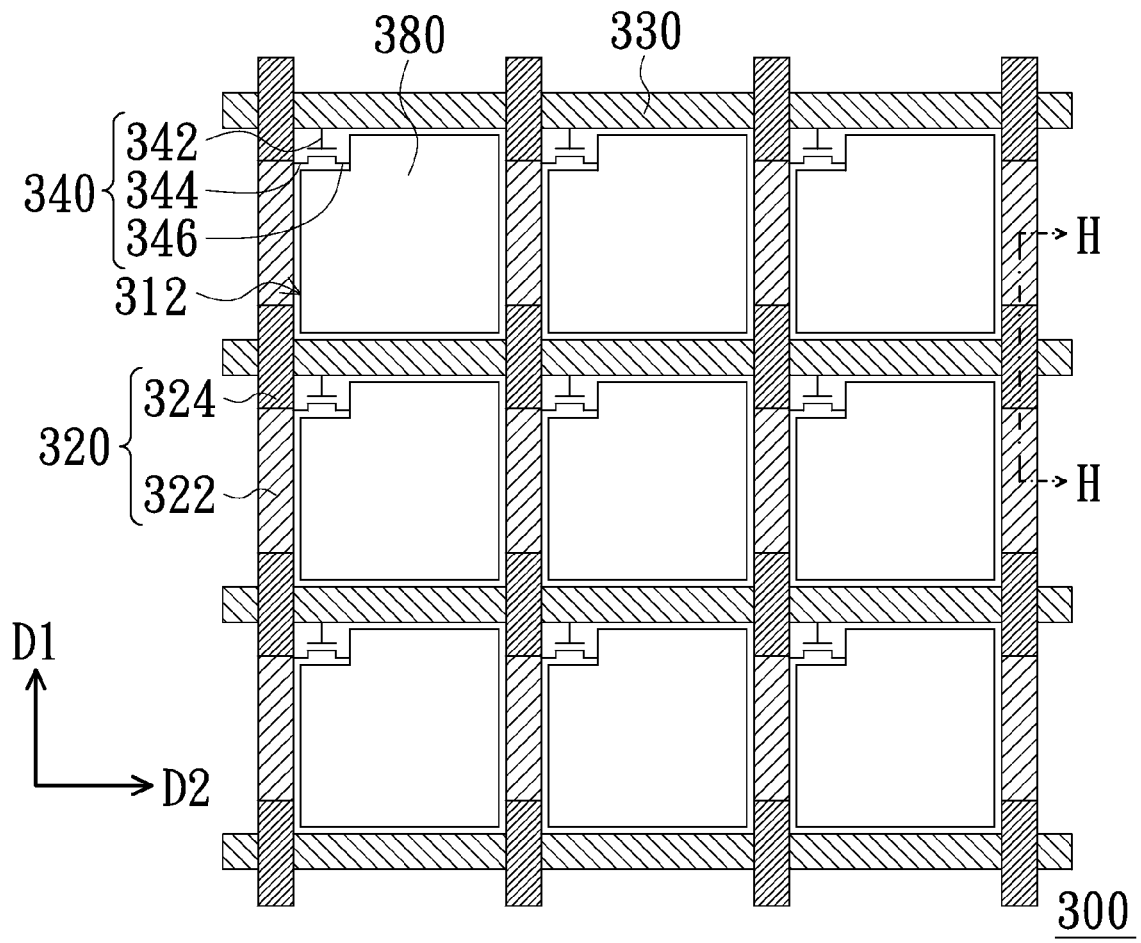
FIG. 15 is a schematic diagram of a driving substrate in accordance with another embodiment of the present invention.
Figure 16:
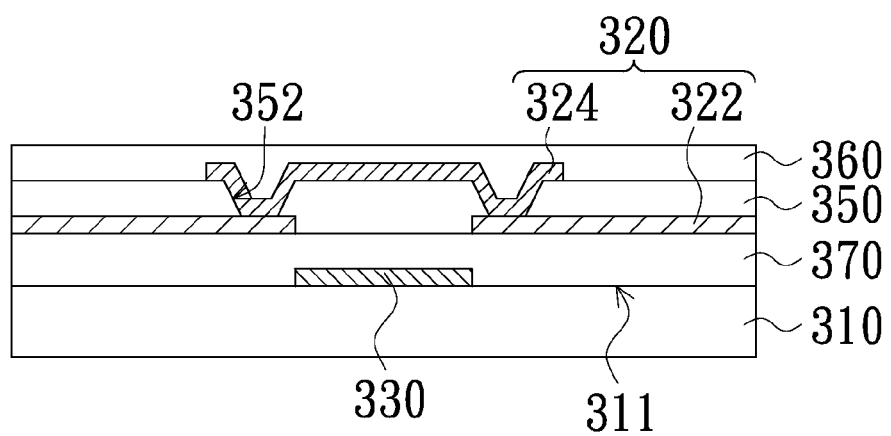
FIG. 16 is a schematic cross-sectional diagram taken along line H-H of FIG. 15.

FIG. 15 is a schematic diagram of a driving substrate in accordance with another embodiment of the present invention, and FIG. 16 is a schematic cross-sectional diagram taken along line H-H of FIG. 15. Referring to FIGS. 15 and 16, the driving substrate 300 of the present embodiment includes a substrate 310, a plurality of first signal transmission lines 320, a plurality of second signal transmission lines 330 and a plurality of switch devices 340. These first signal transmission lines 320 are disposed on the substrate 310 in a first direction D1 and these first signal transmission lines 320 for example are parallel to each other. These second signal transmission lines 330 are disposed on the substrate 310 in a second direction D2 and these second signal transmission lines 330 for example are parallel to each other. These first and second transmission lines 320, 330 are electrically insulated and intersected with each other thereby defining a plurality of pixel regions 312 on the substrate 310. Because the first and second directions D1, D2 are mutually perpendicular, these first and second transmission lines 320, 330 are mutually perpendicular. Therefore, each pixel region 312 has a rectangle structure. These switch devices 340 are respectively disposed in the pixel regions 312; in other words, each pixel region 312 is disposed with one switch device 340. In addition, each switch device 340 is electrically connected to the corresponding first signal transmission line 320 and the corresponding second signal transmission line 330.

Each first signal transmission line 320 includes at least one first line segment 322 and at least one first connecting segment 324. In particular, it is to be noted that each first signal transmission line 320 exemplified in the present embodiment includes more than one first line segments 322 and more than one first connecting segments 324, wherein the layer where these first line segments 322 are disposed is different to the layer where these first connecting segments 324 are disposed. In addition, for each first signal transmission line 320, these first line segments 322 are separated to each other, and the first connecting segment 324 is electrically connected to at least one adjacent first line segment 322. Specifically, at least one of the first connecting segments 324 is electrically connected to one first line segment 322 because of being adjacent to only one first line segment 322. At least one of the first connecting segments 324 is electrically connected to two first line segments 322 because of being adjacent to two first line segments 322.

These first signal transmission lines 320 for example are data lines, and these second signal transmission lines 330 for example are scan lines. These second signal transmission lines 330 are disposed on a surface 311 of the substrate 310. The driving substrate 300 may further include a first insulation layer 350, which is disposed between each first line segment 322 and each first connecting segment 324. The driving substrate 300 may further include a second insulation layer 360, which is disposed to cover the first insulation layer 350 and each first connecting segment 324. The driving substrate 300 may further include a third insulation layer 370, which is disposed to cover the surface 311 and the second signal transmission lines 330. These first signal transmission lines 320 are disposed on the third insulation layer 370.

The first insulation layer 350 has at least one opening 352, and each first line segment 322 can have at least one portion to be exposed through the opening(s) 352. Each first connecting segment 324 is disposed on the first insulation layer 350, and is electrically connected to the adjacent first line segment(s) 322 through the opening(s) 352.

It is understood that, for each first signal transmission line 320, the number of the opening(s) 352 is dependent on the numbers of the first line segment(s) 322 and first connecting segment(s) 324. For example, in the present embodiment each first signal transmission line 320 has multiple openings 352 because each first signal transmission line 320 is exemplarily constructed by more than one first line segments 322 and more than one first connecting segment 324. Moreover, in the case that the first line segment 322 is electrically connected to two first connecting segments 324, there may be two openings 352 related to this first line segment 322 and accordingly two end portions of this first line segment 322 may be respectively exposed by these two related openings 352. On the other hand, if the first line segment 322 is electrically connected to one first connecting segment 324, there may be only one opening 352 related to this first line segment 322 and accordingly only one portion of this first line segment 322 may be exposed by this one related opening 352. Besides, at least one of the first connecting segments 324 is electrically connected to one first line segment 322 because of being adjacent to only one first line segment 122. At least one of the first connecting segments 324 is electrically connected to two first line segments 322 because of being adjacent to two first line segments 322.

In addition, the switch device 340 for example is a thin film transistor. In each pixel region 312, the source 344 of the switch device 340 is electrically connected to the first line segment 322 of the corresponding first signal transmission line 320, and the gate 342 of the switch device 340 is electrically connected to the corresponding second signal transmission line 330. In the driving substrate 300, each pixel region 312 further includes a pixel electrode 380, which is disposed on the second insulation layer 360 and is electrically connected to the drain 346 of the corresponding switch device 340 through an opening(s) (not shown) of the second insulation layer 360. In the present embodiment, these second signal transmission lines 330 are exemplarily disposed to intersect with these first connecting segments 324 of these first signal transmission lines 320, and the first and third insulation layers 350, 370 are disposed between the first connecting segments 324 and the second signal transmission lines 330; however, these second signal transmission lines 330 can be disposed to intersect with these first line segments 322, in another embodiment.

In the driving substrate 300 of the present embodiment, these first signal transmission lines 320 can have a flexural property because each first signal transmission lines 320 is constructed by at least one line segment 322 and at least one connecting segment 324. Therefore, even the substrate 310 is a flexible substrate and the driving substrate 300 has been bent for many times, these first signal transmission lines 320 can be prevented from cracking or breaking due to the flexural property. Accordingly, the driving substrate 300 of the present embodiment has better reliability, so that the display apparatus, which adopts the driving substrate 300, consequently has better reliability.

It is to be noted that, for each first signal transmission line 320, the present invention does not limit the numbers of the first line segment(s) 332 and the second connecting segment(s) 334. In other words, each first signal transmission line 320 can be constructed by one or more than one first line segments 322 and one or more than one first connecting segments 324, wherein the number of the first line segment(s) 324 relates to that of the first connecting segment(s) 322.

Figure 17:
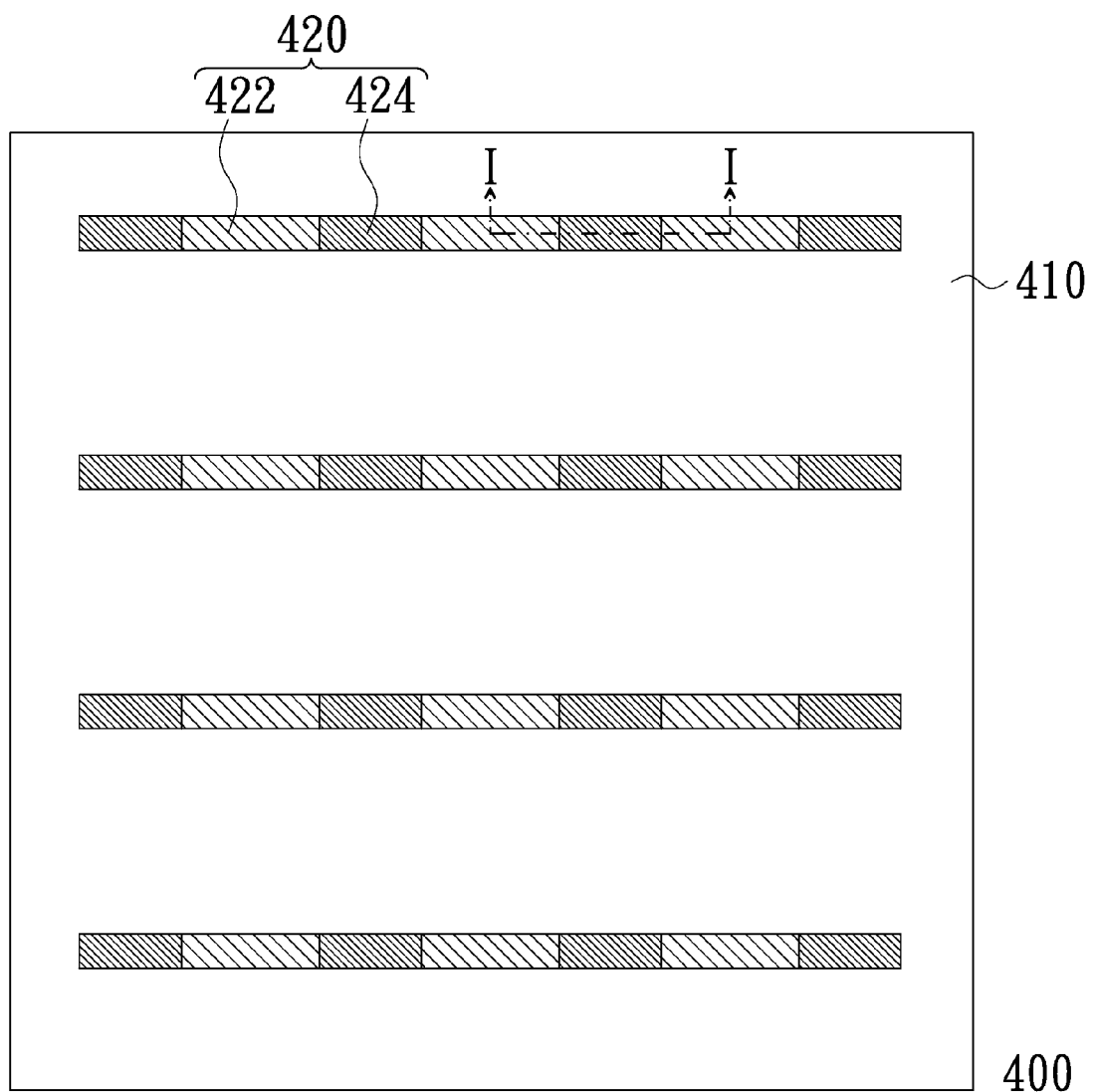
FIG. 17 is a schematic diagram of a driving substrate in accordance with another embodiment of the present invention.
Figure 18:
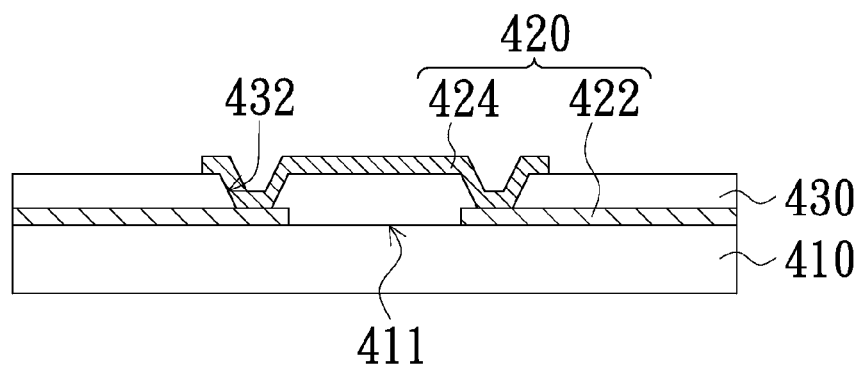
FIG. 18 is a schematic cross-sectional diagram taken along line I-I of FIG. 17.

FIG. 17 is a schematic diagram of a driving substrate in accordance with another embodiment of the present invention, and FIG. 18 is a schematic cross-sectional diagram taken along line I-I of FIG. 17. Referring to FIGS. 17 and 18, the driving substrate 400 of the present embodiment for example is a passive driving substrate and includes a substrate 410 and a plurality of signal transmission lines 420. These signal transmission lines 420 are disposed on the substrate 410 and each signal transmission line 420 includes at least one line segment 422 and at least one connecting segment 424. In particular, it is to be noted that each signal transmission line 420 exemplified in the present embodiment includes more than one line segments 422 and more than one connecting segments 424. Each line segment 422 is disposed on a surface 411 of the substrate 410, and the layer where these line segments 422 are disposed is different to the layer where these connecting segments 424 are disposed. The driving substrate 400 for example further includes an insulation layer 430, which is disposed to cover each line segment 422 and the surface 411. Specifically, the insulation layer 430 has at least one opening 432, and each line segment 422 can have at least one portion to be exposed through the corresponding opening(s) 432. In addition, each connecting segment 424 is disposed on the insulation layer 430 and is electrically connected to the adjacent line segment(s) 422 though the corresponding opening(s) 432.

It is understood that, for each signal transmission line 420, the number of the opening(s) 432 is dependent on the numbers of the line segment(s) 422 and connecting segment(s) 424. For example, in the present embodiment each signal transmission line 420 has multiple openings 432 because each signal transmission line 420 is exemplarily constructed by more than one line segments 422 and more than one connecting segments 424. Moreover, in the case that the line segment 422 is electrically connected to two connecting segments 424, there may be two openings 432 related to this line segment 422 and accordingly two end portions of this line segment 422 may be respectively exposed by these two related openings 432. On the other hand, if the line segment 422 is electrically connected to one connecting segment 424, there may be only one opening 432 related to this line segment 422 and accordingly only one portion of this line segment 422 may be exposed by this one related opening 432.

In the driving substrate 400 of the present embodiment, the signal transmission lines 420 can have a flexural property due to each signal transmission line 420 constructed by at least one line segment 422 and at least one connecting segment 424. Therefore, even the substrate 410 is a flexible substrate and the driving substrate 400 has been bent for many times, these signal transmission lines 420 can be prevented from cracking or breaking because of the flexural property. Accordingly, the driving substrate 400 of the present embodiment has better reliability, so that the display apparatus, which adopts the driving substrate 400, consequently has better reliability.

It is to be noted that, for each signal transmission line 420, the present invention does not limit the numbers of the line segment(s) 422 and connecting segment(s) 424. In other words, each signal transmission line 420 can be constructed by one or more than one line segments 422 and one or more than one connecting segments 424, wherein the number of the line segment(s) 422 relates to that of the connecting segment(s) 424.

Figure 19:
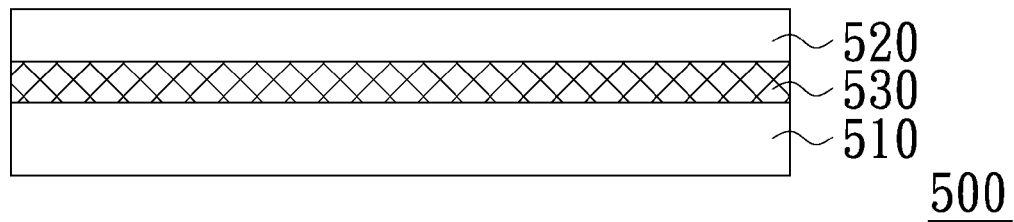
FIG. 19 is a schematic diagram of a display apparatus in accordance with an embodiment of the present invention.

FIG. 19 is a schematic diagram of a driving substrate in accordance with another embodiment of the present invention. As shown in FIG. 19, the display apparatus 500 of the present embodiment includes a driving substrate 510, an opposite substrate 520 and a display layer 530, wherein the opposite substrate 520 is disposed to face to the driving substrate 510, and the display layer 530 is disposed between the driving substrate 510 and the opposite substrate 520. The display layer 530 may be, but not limited to, a liquid crystal display layer or an electrophoretic display layer. In addition, the driving substrate 510 is the driving substrate disclosed in any one of the aforementioned embodiments. Therefore, because each driving substrate disclosed in the aforementioned embodiments has better reliability as described above, the display apparatus 500 of the present embodiment consequently has better reliability.

To sum up, in the driving substrate of each embodiment of the present invention, the signal transmission lines can have a flexural property due to each signal transmission line constructed by at least one line segment and at least one connecting segment which are disposed on different layers. Therefore, even the driving substrate has been bent many times, these signal transmission lines can be prevented from cracking or breaking because of the flexural property. Accordingly, the driving substrate in each embodiment of the present invention has better reliability, and consequently the display apparatus of the present invention has better reliability.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A driving substrate, comprising:
   a substrate;
   a plurality of first signal transmission lines, disposed on the substrate in a first direction, and each the first signal transmission line comprising:
   at least one first line segment; and
   at least one first connecting segment, electrically connected to the adjacent at least one first line segment, wherein the at least one first line segment and the at least one first connecting segment are extended in the same first direction and alternately disposed in the same first direction;
   a first insulation layer covering the at least one first line segment, wherein the at least one first connecting segment is disposed on the first insulation layer, the first insulation layer comprises at least one first opening to expose at least one portion of each the first line segment, and each the first connecting segment is physically and electrically connected to the adjacent first line segment through the corresponding at least one first opening;
   a plurality of second signal transmission lines, disposed on the substrate in a second direction and electrically insulated and intersected with the first signal transmission lines thereby defining a plurality of pixel regions on the substrate, wherein the first and second directions are mutually perpendicular; and
   a plurality of switch devices, respectively disposed in the pixel regions, wherein each the switch device is electrically connected to the corresponding first signal transmission line and the corresponding second signal transmission line.

2. The driving substrate according to claim 1, wherein the first signal transmission lines are scan lines and the second signal transmission lines are data lines, or, the first signal transmission lines are data lines and the second signal transmission lines are scan lines.

3. The driving substrate according to claim 1, wherein each the first line segment is disposed on a surface of the substrate and the driving substrate further comprises:
   a second insulation layer, disposed to cover the first insulation layer and each the first connecting segment, wherein the second signal transmission lines are disposed on the second insulation layer.

4. The driving substrate according to claim 3, wherein the numbers of the at least one connecting segment and the at least one first line segment respectively are multiple, the switch devices are thin film transistors, and each the first connecting segment is electrically connected to a gate of the corresponding switch device.

5. The driving substrate according to claim 3, wherein the numbers of the at least one first connecting segment and the at least one first line segment respectively are multiple, the switch devices are thin film transistors, and each the first line segment is electrically connected to a gate of the corresponding switch device.

6. The driving substrate according to claim 3, wherein the numbers of the at least one first connecting segment and the at least one first line segment respectively are multiple, and the second signal transmission lines are intersected with the first connecting segments.

7. The driving substrate according to claim 3, wherein the numbers of the at least one first connecting segment and the at least one first line segment respectively are multiple, and the second signal transmission lines are intersected with the first line segments.

8. The driving substrate according to claim 3, wherein each the second signal transmission line comprises at least one second connecting segment and at least one second line segment, each the second line segment is disposed on the second insulation layer, and the driving substrate further comprises:
   a third insulation layer, disposed to cover each the second signal transmission line; and
   a fourth insulation layer, disposed between the second and third insulation layers to cover the at least one second line segment, wherein the at least one second connecting segment is disposed on the fourth insulation layer, the fourth insulation layer comprises at least one second opening to expose at least one portion of each the second line segment, and each the second connecting segment is physically and electrically connected to the second line segment through the corresponding at least one second opening.

9. The driving substrate according to claim 8, wherein the numbers of the at least one second connecting segment and the at least one second line segment respectively are multiple, and the second connecting segments are intersected with the first signal transmission lines.

10. The driving substrate according to claim 3, further comprising a plurality of common lines electrically insulated and intersected with the second signal transmission lines, wherein each the common line is disposed between the adjacent first signal transmission lines and comprises:
at least one third line segment, disposed on the surface of the substrate and covered by the first insulation layer, wherein the first insulation layer further comprises at least one third opening to expose at least one portion of each the third line segment; and
at least one third connecting segment, disposed on the first insulation layer and covered by the second insulation layer, wherein each the third connecting segment is electrically connected to the third line segment through the corresponding at least one third opening.

11. The driving substrate according to claim 10, wherein the numbers of the at least one third connecting segment and the at least one third line segment respectively are multiple, and the third connecting segments are intersected with the second signal transmission lines.

12. The driving substrate according to claim 1, wherein the numbers of the at least one first connecting segment and the at least one first line segment respectively are multiple, each the second signal transmission line comprises a plurality of second line segments and a plurality of second connecting segments, each the first line segment and each the second line segment are disposed on a surface of the substrate, the first insulation layer is disposed to cover each the first line segment, each the second line segment and the surface of the substrate, the first insulation layer further comprises at least one fourth opening to expose at least one portion of each the second line segment, each the second connecting segment is electrically connected to the second line segment through the corresponding at least one fourth opening, and the driving substrate further comprises:
a second insulation layer, disposed to cover the first insulation layer, each the first connecting segment and each the second connecting segment.

13. The driving substrate according to claim 1, wherein the second signal transmission lines are disposed on a surface of the substrate, and the driving substrate further comprises:
a second insulation layer, disposed to cover the first insulation layer and each the first connecting segment; and
a third insulation layer, disposed to cover the surface of the substrate and the second signal transmission lines, wherein the first signal transmission lines are disposed on the third insulation layer.

14. The driving substrate according to claim 1, wherein the substrate is a flexible substrate.

15. A display apparatus, comprising:
a driving substrate as claimed in claim 1;
an opposite substrate, disposed to face to the driving substrate; and
a display layer, disposed between the driving substrate and the opposite substrate.

16. The display apparatus according to claim 15, wherein the display layer is a liquid crystal display layer or an electrophoretic display layer.

17. The driving substrate according to claim 1, wherein the first connecting segment is flexible.

18. A driving substrate, comprising:
a substrate;
a plurality of signal transmission lines, disposed on the substrate and each the signal transmission line comprising at least one line segment and at least one connecting segment, wherein each the line segment is disposed on a surface of the substrate; and
an insulation layer, disposed to cover each the line segment and comprising at least one opening to expose at least one portion of each the line segment, wherein each the connecting segment is disposed on the insulation layer and physically and electrically connected to the adjacent at least one line segment through the corresponding at least one opening, and the at least one line segment and the at least one connecting segment are extended in a same direction and alternately disposed in the same direction.

19. The driving substrate according to claim 18, wherein the connecting segment is flexible.

* * * * *